United States Patent [19]

Kumar

[11] Patent Number: 5,165,051
[45] Date of Patent: Nov. 17, 1992

[54] MODIFIED FAST FREQUENCY ACQUISITION VIA ADAPTIVE LEAST SQUARES ALGORITHM

[75] Inventor: Rajendra Kumar, Cerritos, Calif.

[73] Assignee: The United States of America as represented by the Administrator of the National Aeronautics and Space Administration, Washington, D.C.

[21] Appl. No.: 799,857

[22] Filed: Nov. 27, 1991

Related U.S. Application Data

[63] Continuation of Ser. No. 523,692, May 15, 1990, abandoned.

[51] Int. Cl.$^5$ .............................................. H03B 1/04
[52] U.S. Cl. ............................. 324/79 D; 324/79 R; 324/83 Q; 364/724.06; 364/724.07; 364/724.08; 342/100
[58] Field of Search ............... 455/304, 305, 208, 183; 342/192, 100; 364/724.06, 724.07, 724.08; 324/83 Q, 79 D, 79 R, 78 D

[56] References Cited

U.S. PATENT DOCUMENTS

| | | | |
|---|---|---|---|
| 3,633,117 | 1/1972 | Reilly ................................. | 324/83 Q |
| 3,753,123 | 8/1973 | Carpenter ............................ | 455/305 |
| 3,757,214 | 9/1973 | Kaufman ............................ | 324/83 Q |
| 4,016,528 | 4/1977 | Takeuchi ............................ | 342/160 |
| 4,179,696 | 12/1979 | Quesinberry et al. . | |
| 4,232,400 | 11/1980 | Yamamoto ........................... | 455/305 |
| 4,285,060 | 8/1981 | Cobb ................................... | 455/304 |
| 4,380,082 | 4/1983 | Namiki ................................ | 455/305 |
| 4,471,357 | 9/1984 | Wu et al. . | |
| 4,479,258 | 10/1984 | Namiki ................................ | 455/305 |
| 4,481,464 | 11/1984 | Noguchi ............................. | 324/650 |
| 4,533,918 | 8/1985 | Virnot . | |
| 4,561,067 | 12/1985 | McKeown .......................... | 455/305 |
| 4,686,532 | 8/1987 | McAulay . | |
| 4,989,262 | 1/1991 | Saito ................................... | 455/305 |

OTHER PUBLICATIONS

Maeda: "An Automatic, Precision 1-MHZ Digital LCR Meter"—HP Journal-Mar. 1974.

Primary Examiner—Kenneth A. Wieder
Assistant Examiner—Jose M. Solis
Attorney, Agent, or Firm—John H. Kusmiss; Thomas H. Jones; Guy M. Miller

[57] ABSTRACT

This is a method and associated apparatus for accurately and quickly estimating the amplitude, frequency and phase of a signal of interest. The method comprises the steps of, inputting the signal of interest; generating a reference signal with adjustable amplitude, frequency and phase at an output thereof; mixing the signal of interest with the reference signal and a signal 90° out of phase with the reference signal to provide a pair of quadrature sample signals comprising respectively a difference between the signal of interest and the reference signal and a difference between the signal of interest and the signal 90° out of phase with the reference signal; using the pair of quadrature sample signals to compute estimates of the amplitude, frequency, and phase of an error signal comprising the difference between the signal of interest and the reference signal employing a least squares estimation; adjusting the amplitude, frequency, and phase of the reference signal from the numerically controlled oscillator in a manner which drives the error signal towards zero; and, outputting the estimates of the amplitude, frequency, and phase of the error signal in combination with the reference signal to produce a best estimate of the amplitude, frequency, and phase of the signal of interest. The preferred method includes the step of providing the error signal as a real time confidence measure as to accuracy of the estimates wherein the closer the error signal is to zero, the higher the probability that the estimates are accurate. A matrix in the estimation algorithm provides an estimate of the variance of the estimation error.

22 Claims, 2 Drawing Sheets

MODIFIED FAST FREQUENCY ACQUISITION VIA ADAPTIVE LEAST SQUARES ALGORITHM

ORIGIN ON THE INVENTION

The invention described herein was made in the performance of work under a NASA contract, and is subject to the provisions of Public Law 96-517 (35 USC 202) in which the Contractor has elected not to retain title.

This application is a continuation of application Ser. No. 523,692, filed May 15, 1990, now abandoned.

TECHNICAL FIELD

The invention relates to signal analysis apparatus and methods and, more particularly, a method of accurately and quickly estimating the amplitude, frequency and phase of a signal of interest.

BACKGROUND ART

The problem of estimating the parameters of a sinusoidal signal has received considerable attention in the literature and in various prior art patents. Such a problem arises in diverse engineering situations such as carrier tracking for communications systems and the measurement of Doppler in position location, navigation, and radar systems.

A variety of techniques have been proposed in the literature to solve such problems including, to mention a few, the application of the Fast Fourier Transform (FFT), one and two-dimensional Kalman filters based on a linearized model, a modified Kalman filter that results in a phase locked loop, and a digital phase locked loop derived on the basis of linear stochastic optimization.

U.S. Pat. No. 4,686,532 of McAulay describes a system for determining the strength of distributed scatterers (say P in number) that are possibly close to the sonar or radar relative to the array dimension of size I. Assuming that P scatterers rediate signals at some of the L Doppler frequencies known in advance, the method uses a least squares approach to estimate the complex amplitude of these P scatterers at each of these L possible frequencies. It is also assumed that various attenuations, time delays and angles between the P scatterers and I receivers are available via some other means. Since, of course, the Dopplers are not known a-priori, the method would essentially segment the entire Doppler range into intervals of delta-f and measure the complex signal amplitude of each of these frequencies and at each of the I receivers by some prior known method. Essentially, the method obtains the knowledge of the spectral contents of the scatterers from the known spectral contents of the received signals. It does not address the problem of how to obtain the spectral contents of the received signal. This latter problem is the subject of the present invention. Moreover, the framework of the scheme is also very computationally intensive as it involves an exhaustive search in the Doppler domain. It also does not take into consideration the time-varying Doppler—a clear possibility in a near field situation. Thus, in this framework, a discrete scatterer with time-varying Doppler would be identified by L complex amplitudes that are functions of time rather than identifying it as a single sinusoidal signal with time-varying amplitude, phase and frequency as would be more desirable.

U.S. Pat. No. 4,533,918 of Virnot describes a device working with radar equipment to obtain the location of a target. This is achieved by a Kalman filter type of circuit that operates on the samples of range measurements from the ship to a plurality of known landmarks. The range measurement is done by conventional pulse radar. It does not describe any scheme for Doppler measurement, which is part of the area of interest addressed by this invention.

U.S. Pat. No. 4,179,696 of Quesinberry contains a Kalman estimator which essentially transforms the line-of-sight (LOS) measurement data (i.e. range, angle, etc.) to obtain the target position as referenced to a stable coordinate system. This again is a quite different problem. It involves no scheme for a Doppler measurement and is essentially concerned with the transformation of one set of data (LOS coordinates) into a different set (fixed or stable coordinates) as is the case with the Virnot patent mentioned above.

The patent of Wu (U.S. Pat. No. 4,471,357) describes a method of two-dimensional processing of SAR images which is an entirely different problem than that of primary concern herein.

The following general commentary may be helpful in placing a proper perspective on the present invention as will be described hereinafter in relation to least squares algorithms and the Kalman filter. The basic idea of minimizing the sum of squares of the residuals goes back to Gauss in the 19th century who applied it to the study of problems in celestial mechanics. Since then, as is evidenced by a very large body of published scientific research, this generic idea has permeated through many scientific, engineering, and other fields. In this regard, the celebrated Kalman filter is also a specific implementation of the least squares algorithm; but, limited to a very structured problem of linear systems with Gaussian noise. For the more general nonlinear case (as is true with the environment of principal concern herein) there is no single scheme of a general nature. One possible solution, although not always satisfactory, is to use a linear approximation and apply the Kalman algorithm to this linearized model. A sinusoidal function can hardly be considered to be linear except over a very small segment. Thus, the above-referenced algorithms, although using least squares and Kalman filters, do not solve this problem.

Indeed, the fact that there are so many different techniques to solve the problem indicates the importance of the problem. This, however, also implies that there is no single technique superior to all others in all possible situations and/or with respect to different criteria such as computational complexity, statistical efficiency, etc.

STATEMENT OF THE INVENTION

Accordingly, it is the object of this invention to provide a novel and elegant least squares scheme for the nonlinear estimation problem of estimating the phase, frequency, and amplitude of a sinusoid, very rapidly and precisely without making any linearizing approximation.

Other objects and benefits of the invention will become apparent from the detailed description which follows hereinafter when taken in conjunction with the drawing figures which accompany it.

DETAILED DESCRIPTION OF THE INVENTION

Figure 1:
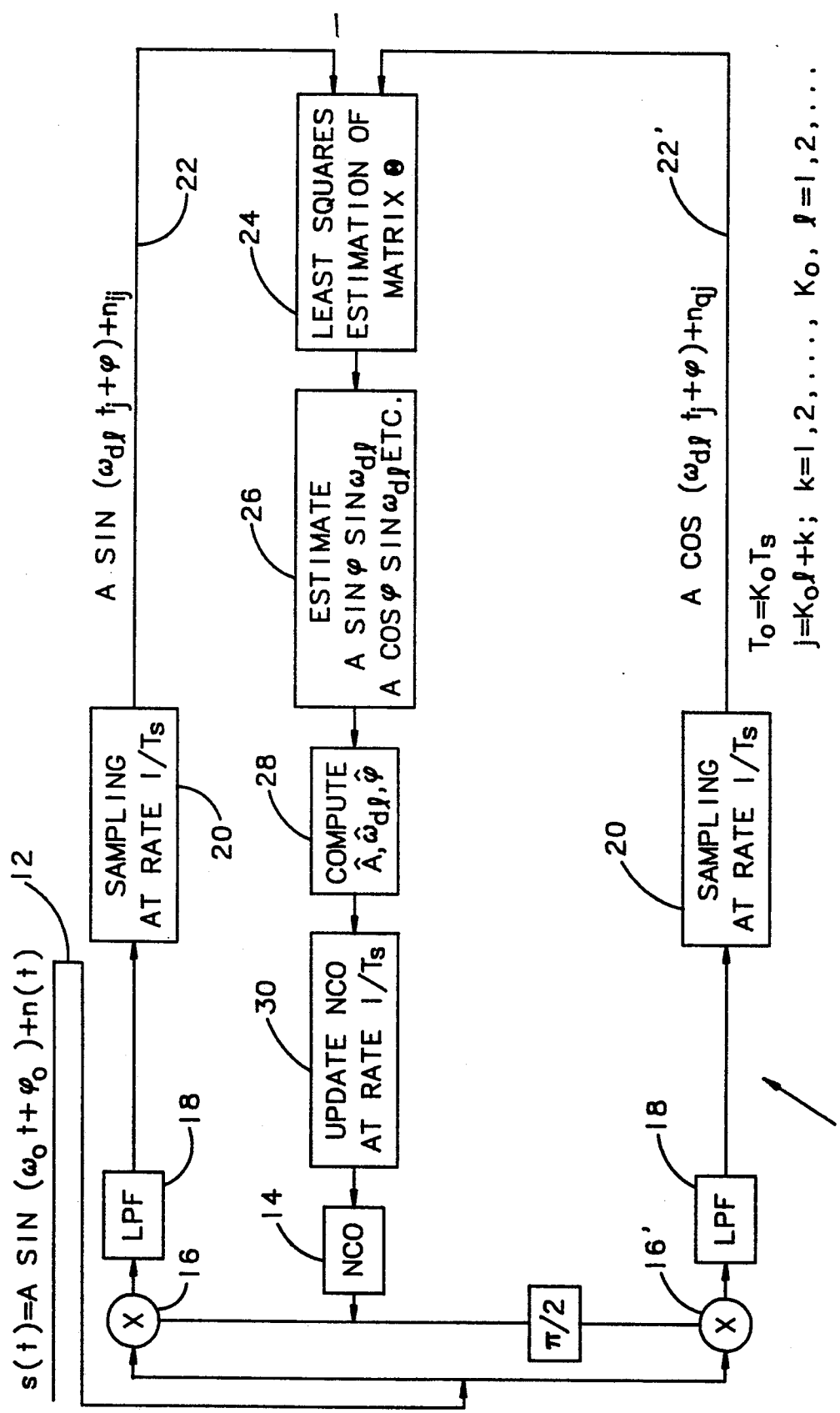
FIG. 1 is a simplified functional block diagram of a system employing the method of the present invention to estimate the frequency, phase, and amplitude of an incoming signal of interest.

The methods and apparatus to be described hereinafter are based on a new least squares algorithm which can be employed to advantage for fast frequency and phase acquisition of sinusoids in the presence of noise. The algorithm is a special case of more general adaptive parameter estimation techniques. The advantage of this particular algorithm is its conceptual simplicity, flexibility, and application to general situations. For example, the frequency to be acquired can be time varying, and the noise can be non-Gaussian, non-stationary, and colored. As the algorithm can be made recursive in the number of observations, it is not necessary to have a-priori knowledge of the received signal-to-noise ratio or to specify the measurement time. This, of course, would be required for batch processing techniques such as the Fast Fourier Transform (FFT). The algorithm also improves the frequency estimate on a resursive basis as more and more observations are obtained. When the algorithm is applied in real time, it has the extra advantage that the observations need not be stored. The algorithm also yields a real time confidence measure as to the accuracy of the estimator.

The inventor herein has authored a paper entitled "Fast frequency acquisition via adaptive least-squares algorithm" (hereinafter referred to as "the Paper") which describes his early work with respect to his algorithm. The Paper was published in the Proceedings of the International Telemetering Conference, Las Vegas, pp. 91–101, Oct., 1986 and later re-published in extended and modified form in the IEE PROCEEDINGS, Vol. 136, Pt.F, No.4, Aug. 1989. Therefore, the contents of the Paper in its 1986 version only are prior art to the present invention which comprises a novel improvement to that prior work thereby solving certain problems associated therewith. For simplicity, a copy of the extended and modified form of the Paper is attached hereto as Appendix A and the contents thereof are incorporated herein by reference. Only those aspects which are an improvement over the disclosure of the Paper will be addressed in detail hereinafter.

The algorithm as disclosed herein differs from the present inventor's earlier published work in the Paper in several non-obvious and important ways which will now be delineated.

To keep the truncation errors small, the dimension n of the state vector $x_k$ in equations (4) and (5) of the Paper must satisfy the following bound:

$$n \geq \Omega T$$

where $\Omega$ is the initial frequency uncertainty in rad/s and T is the observation interval. Thus, for example, if $\Omega = 2\pi \times 100$ rad/s and T = 0.1s, then the dimension n must be at least 60. If the observation interval is increased to 1s, n must be greater than 600. Moreover, as the computational requirements (in one implementation) for processing each signal sample increase as $n^2$, one would require in the order of 3,600 and 360,000 operations respectively for these two examples. Obviously, this is a very high computational requirement and in actual practice one has to simplify the algorithm perhaps by some simple ad hoc procedure to keep the computational requirements manageable. However, such a possible ad hoc simplification would result in the loss of optimality in terms of the estimation errors.

Related to the foregoing is the fact that the variance of the frequency estimation error given by equation (16) of the Paper contains a constant K. For low values of the state dimension n, the constant K is equal to 4 and then the results correspond to the bound for optimum variance derived in the literature for the case of high signal-to-noise ratio (SNR). For high value of n, however, K may be higher. The reason for this is that equation (16) is derived when $\omega_d$ is estimated via equation (12) and is based on just two major elements of the parameter matrix $\theta$. For a low SNR case and/or high value of n, to keep the optimality, the final estimate of $\omega_d$ should be based on the complete matrix. Thus, a procedure is required for optimally combining the elements of $\theta$ so as to yield an optimum estimate for $\omega_d$ for all conditions. The present invention accomplishes this.

Since the algorithm is based on minimizing the error between the estimated frequency and phase at any particular instant in time and the present value of a standard against which the incoming signal of interest is compared, the computational requirements of the algorithm as presented in the Paper tended to increase continually as the number of terms to be computed also continued to increase. This, of course, is not a desirable attribute under actual working conditions. That is, the present inventor's prior work provided to be suitable for its intended purpose under short term laboratory conditions; but, would impose an inordinate computational load on actual field equipment employing the algorithms thereof. The present invention eliminates that problem.

Finally, it was not obvious or apparent from the disclosure of the Paper how the basic algorithm could be extended to the important case of M sinusoids. The present invention discloses this aspect for the first time.

Thus, although the present inventor's prior publications introduced a novel concept, they did not contain a simple realizable algorithm except in some limited cases as for the case of small values of $\Omega T$ product. The extension to the more general problem of estimating several sinusoid was not attempted as the way for such a generalization was not clear at the time. The present invention provides elegant solutions to all of the above-described problems as will now be discussed in detail.

FIG. 1 shows the manner in which the present invention can be implemented. The system 10 inputs the signal of interest at 12. The signal 12 is mixed with the output of a numerically controlled oscillator (NCO) 14 and a signal 90° out of phase with the output of the NCO 14 at the mixers 16, 16', respectively. As is well known, when two frequencies are mixed together, there are two outputs from the mixing process, their sum and their difference. The lower possible frequency (i.e. the difference), of course, also represents the error between the two frequencies. Thus, in the system 10 of FIG. 1, the sum frequency signals are removed at 18 and the difference frequency signals are sampled at 20 to provide quadrature sample signals at 22 and 22'. The two quadrature sample signals 22,22' are then employed at 24,26, and 28 to compute estimates of the amplitude, frequency, and phase of the error signal generally according to the techniques of the Paper. At 30 the NCO 14 is adjusted in a manner which will tend to drive the error towards zero. The error amount is what acts as a real time confidence measure as to the accuracy of the estimator as mentioned earlier herein; that is, as the computation progresses over multiple samples and the estimation closes in on the actual amplitude, frequency and phase, the error approaches zero. Thus, the closer the error is to zero, the higher the probability that the estimate is accurate. A matrix implemented as part of the estimation algorithm actually provides an estimate of the variance of the estimation error.

In the algorithm according to the present invention, the dimension of the state vector n is determined from equation (18) of the Paper and is given by:

$$n = \left(216 \frac{N_O}{P} \Omega\right)^{\frac{1}{4}}$$

and thus n is made independent of the observation interval T. Thus, for $\Omega = 200\ \pi\text{rad/s}$ and a typical value of $P/N_O 24$ dB-Hz(251), the required value of n is equal to 8 as against $n > 60$ required before for the case of $T = 0.1s$. This reduces the computational requirements by a factor of more than 50. For the case of $T = 1s$, the improvement factor is 2,500. The important thing to realize is that n is no longer a function of T. This is achieved by segmenting the total observation period into $T_O = n\Omega^{-1}s$ intervals, applying the algorithm to successive intervals as described in the Paper, and at the end of each interval applying a frequency and phase correction to the NCO 14 of FIG. 1. The overall effect of this method is that the algorithm effectively seems to be operating on a smaller than $\omega_{d0}$ initial frequency $\omega_{d1}$ between (0, $2T_O$), an even smaller frequency $\omega_{d2}$ between (0, $3T_O$) and so on without losing any optimality in terms of the estimation accuracy. This is because, according to the present invention, the frequency and phase of the NCO 14 are constantly being adjusted towards the actual incoming signal of interest such that the error is driven towards zero and, correspondingly, the number of terms to be computed decreases as the error also decreases rather than increasing as in the prior art approach described in the Paper. This is undoubtedly the major contribution of the present invention as it turns what would otherwise have been a very limited use algorithm into a most viable approach to solving the problem at hand on a commercial and practical basis.

Figure 2:
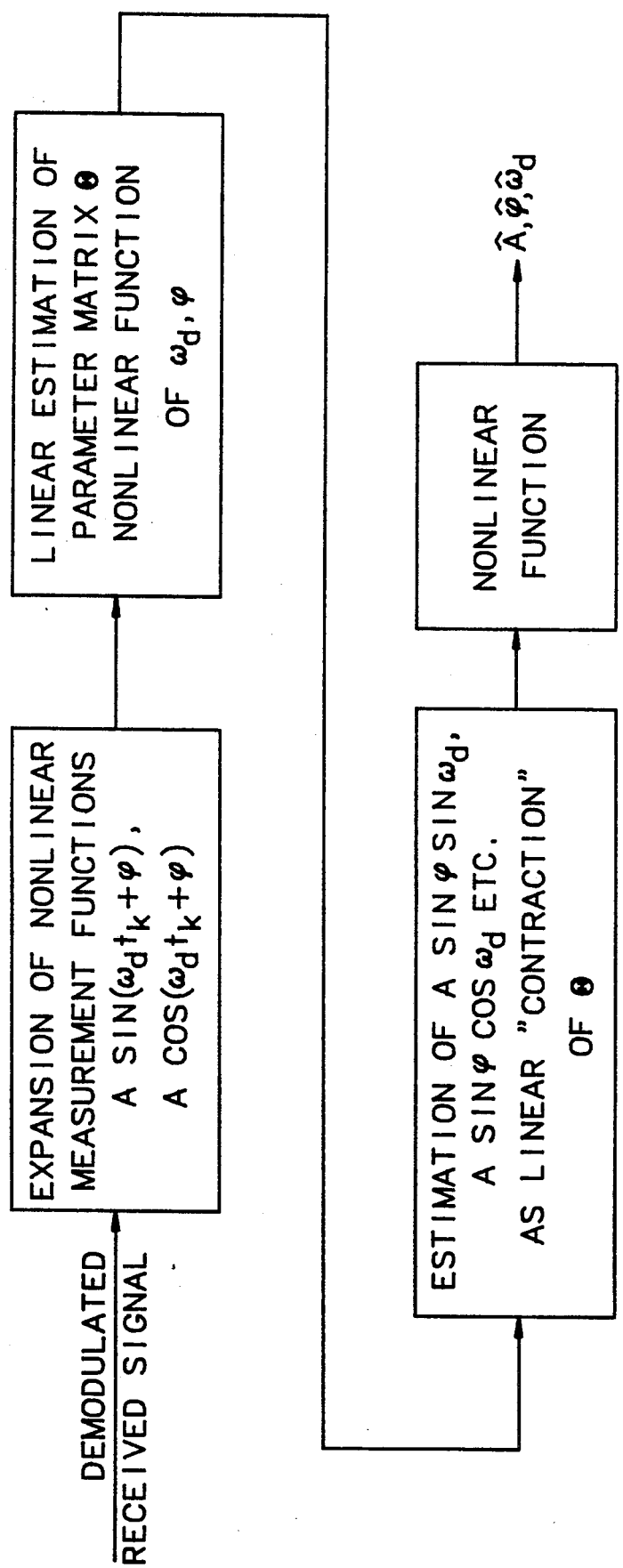
FIG. 2 is a conceptual aid to the understanding of the overall algorithm of the present invention.

The present invention can employ either of two methods which combine the elements of the matrix $\theta$ so as to produce the optimal estimate of $\omega_d$ rather than deriving it on the basis of just two elements of $\theta$ via equation (12) as was previously done at the cost of losing optimality, especially for the cases of large n and low SNR. According to one method, by simply adding the appropriate terms of $\theta$ one can estimate Sin $\omega_d$ and Cos $\omega_d$. From a well known theorem in estimation theory, optimality of $\theta$ also implies the optimality of the estimates of Sin $\omega_d$ and Cos $\omega_d$. From these estimates $\omega_d$ is then uniquely estimated. The alternate method is to apply Prony's method [see N. Mohanty, *Random Signal Estimation and Identification*, Van Nostrand Reinhold Company, New York, 1986] to optimally estimate $\omega_d$ from the matrix $\theta$ as shown in the Paper. FIG. 2 is included herewith as a conceptual aid in the understanding of the overall algorithm of the present invention.

A detailed description by the inventor herein relative to extending the adaptive least-squares algorithm of the present invention to multiple sinusoids is attached hereto as Appendix A and the contents thereof are incorporated herein by reference.

APPENDIX A

Fast Frequency Acquisition Via Adaptive Least-Squares Algorithm

Consider the problem of estimating an unknown frequency $w_d$ from the measurement $y_k$, $z_k$ below:

$$\left. \begin{array}{l} y_k = A \sin(w_d t_k + \phi) + n_{ik} \\ z_k = A \cos(w_d t_k + \phi) + n_{qk} \end{array} \right\} k = 1, 2, \ldots \quad (1)$$

Here, $\{y_k, z_k\}$ represent the samples of the inphase and quadrature components of a received signal s(t) obtained by demodulating s(t) by a carrier reference signal r(t) and its 90° phase-shifted version respectively, i.e.

$$s(t) = A \sin(w_o t + \phi_o) + n(t)$$

$$r(t) = 2 \sin(w_c t + \phi_c); \phi = \phi_o - \phi_c, w_d = w_o - w_c \quad (2)$$

with $n_{ik}$ and $n_{qk}$ denoting the inphase and quadrature components of white noise n(t) with variance $\sigma^2$. The algorithm can be easily extended to the case where n(t) is a colored noise.

The measurement equations can be written in alternative forms as follows:

$$y_k = A \sin(w_d t_k) \cos\phi + A \cos(w_d t_k) \sin\phi + n_{ik}$$

$$z_k = A \cos(w_d t_k) \cos\phi - A \sin(w_d t_k) \sin\phi + n_{qk} \quad (3)$$

or, with a power series expansion for the sine and cosine functions, as $$\begin{bmatrix} y_k \\ z_k \end{bmatrix} = \begin{bmatrix} A \sin\phi & A(\cos\phi)w_d - \frac{A\sin\phi}{2!} w_d^2 - \cdots \frac{A\cos\phi}{3!} w_d^3 \cdots \frac{A\sin\phi}{(n-1)!} w_d^{n-1} \\ A \cos\phi & -A(\sin\phi)w_d - \frac{A\cos\phi}{2!} w_d^2 + \cdots \frac{A\sin\phi}{3!} w_d^3 \cdots \frac{A\cos\phi}{(n-1)!} w_d^{n-1} \end{bmatrix} \times \begin{bmatrix} 1 \\ t_k \\ t_k^2 \\ \cdot \\ \cdot \\ \cdot \\ t_k^{n-1} \end{bmatrix} + \begin{bmatrix} n_{ik} \\ n_{qk} \end{bmatrix} \quad (4)$$

In the above approximation the terms of the order $(w_d t_k)^n/n!$ and smaller order have been ignored (assuming here that $w_d t_k < n$). With obvious definitions, the measurement equation can be written in a form 'linear in parameters':

$$Z_k = \theta' x_k + n_k \quad (5)$$

In the above, ' denotes transpose, $Z'_k = [y_k\ z_k]$, $n'_k = [n_{ik}\ n_{qk}]$, $x'_k$ denotes the observable state vector $[1\ t_k\ t_k^2 \ldots t_k^{n-1}]$ and $\theta'$ is the unknown parameter matrix. A standard least-squares algorithm can be applied to estimate the unknown parameter matrix $\theta'$ from the sequence of noisy observations $Z_k$, $k=1, 2, \ldots, N$.

The parameter matrix $\theta'$ can be estimated by either a recursive or nonrecursive form. We consider the nonrecursive form. The estimate of $\theta$ on the basis of measurement $Z_k$, $k=1,2,\ldots,N$, denoted $\hat{\theta}_N$, is given by $$\hat{\theta}_N = \left(\sum_{j=1}^{N} x_j x'_j \lambda^{N-j}\right)^{-1} \left(\sum_{j=1}^{N} x_j Z'_j \lambda^{N-j}\right) \tag{6}$$

where $0<\lambda<1$ is the exponential data weighting factor. From $\hat{\theta}_N$, the estimates of A, $w_d$ and $\phi$ can be obtained.

The algorithm of Equation 6 requires an inverse of a symmetric (n×n) matrix once, requiring order $n^2$ computations. It may appear that the computation of each $x_j x'_j$ term requires $n^2$ computations. However, detailed examination shows that only 2n computations are required. Thus, the total number of computations is equal to $6nN+O(n^2)$. In practice, the matrix inverse can be precomputed, thus reducing the data-dependent computations to only $2nN+(n^2/2)$.

The matrix $-\frac{1}{\underline{\underline{\underline{\underline{\underline{}}}}}} (\Sigma_{j=1}^N x_j x'_j \lambda^{N-j})$ in Equation 6 has a very special structure as can easily be seen by explicit computation of the term $x_j x'_j$ of the summand. Thus, $$x_j x'_j = \begin{bmatrix} 1 & t_j & t_j^2 & \cdots & t_j^{n-1} \\ t_j & t_j^2 & t_j^3 & \cdots & t_j^n \\ \cdot & & & & \\ \cdot & & & & \\ \cdot & & & & \\ t_j^{n-1} & t_j^n & \cdot & \cdots & t_j^{2n-2} \end{bmatrix} \tag{7}$$

Each of the matrices $x_j x'_j$ and $P^{-1}$ is a Hankel matrix. That is, all the elements of each crossdiagonal are the same. The structure of Hankel matrix is very similar to that of a Toeplitz matrix wherein the elements along the various subdiagonals are equal. The well-known fast algorithm disclosed in Kumar, "A Fast Algorithm for Solving a Toeplitz System of Equations," *IEEE Transactions*, 1985, ASSP-33 (1), pp. 254-267 for the solution of a Toeplitz system of equations can be slightly modified so as to become applicable to the present problem. Thus, Equation 6 can be solved in order n $(\log_2 n)^2$ computations, resulting in a considerable reduction in the requirement for large values of n.

If the matrix inverse is precomputed then, with the well-known fast algorithm referenced above, the solution for $\hat{\theta}_N$ can be obtained in approximately 6n $\log_2 n$ operations. In the implementations above, it is sufficient to store only the first row and column of P or $P^{-1}$.

In this case only the measurements $\{y_k\}$ are available and the parameter matrix $\theta'$ is of dimension n×1. In such an implementation, however, there may result an ambiguity of $\pi$ radians in the phase estimate if the sign of $w_d$ is also unknown.

Assuming that the model Equation 5 is exact (the dimension n of the parameter matrix is Equation 4 is sufficiently high), then the substitution of Equation 5 in Equation 6 yields $$\hat{\theta}_N = \left(\sum_{j=1}^{N} x_j x'_j \lambda^{N-j}\right)^{-1} \left(\sum_{j=1}^{N} x_j (x'_j \theta + n'_j) \lambda^{N-j}\right) \tag{8}$$

A simple manipulation of Equation 8 yields the estimation error $$\tilde{\theta}_N \overset{\Delta}{=} \theta - \hat{\theta}_N \text{ as}$$

$$\tilde{\theta}_N = -\left(\sum_{j=1}^{N} x_j x'_j \lambda^{N-j}\right)\left(\sum_{j=1}^{N} x_j n'_j \lambda^{N-j}\right) \tag{9}$$

As the state vector $x_j$ is deterministic and $n_j$ is a zero mean process, $\tilde{\theta}_N$ has its mean equal to zero. The error covariance matrix of $\tilde{\theta}_N$ can also be evaluated in a straightforward manner. Postmultiplying Equation 9 by the transpose of $\tilde{\theta}_N$ and taking expected values of both sides gives $$E[\tilde{\theta}_N \tilde{\theta}'_N] = \left(\sum_{j=1}^{N} x_j x'_j \lambda^{N-j}\right)^{-1} \times \tag{10}$$

$$\left(\sum_{j=1}^{N} \sum_{i=1}^{N} x_j E[n'_j n_i] x'_i \lambda^{2(N-j)}\right) \times \left(\sum_{i=1}^{N} x_j x'_j \lambda^{N-j}\right)^{-1},$$

considering the case of $\lambda=1$ and recalling that $\{n_j\}$ is a white noise sequence $$E[\tilde{\theta}_N \tilde{\theta}'_N] = \left(\sum_{j=1}^{N} x_j x'_j\right)^{-1} \sigma^2,$$

$$E[\|n_j\|^2] = E[n_{ij}^2] + E[n_{ij}^2] + E[n_{qj}^2] = \sigma^2 \tag{11}$$

A simple approximate expression can also be obtained for the frequency estimation error when the amplitude A is known and uniform sampling is used. The frequency estimate $\hat{w}_d$ can be obtained as $$\hat{w}_{d,N} = \{(\hat{\theta}_N^{21})^2 + (\hat{\theta}_N^{22})^2\}^{\frac{1}{2}} A^{-1} \tag{12}$$

When the amplitude A is also unknown, it can be replaced by its estimate given by $$\hat{A}_N = \{(\hat{\theta}_N^{11})^2 + (\hat{\theta}_N^{12})^2\}^{\frac{1}{2}} \tag{13}$$

In the above expressions, $\hat{\theta}_N^{i,j}$ denotes the (i,j)th element of the parameter matrix $\hat{\theta}_N$. The error variance of these elements of interest is given by $$E[(\tilde{\theta}_N^{21})^2] + E[(\tilde{\theta}_N^{22})^2] \approx K\sigma^2 \left(\sum_{j=1}^{N} t_j^2\right)^{-1} \tag{14}$$

where K approaches a constant with the increase in the numbers of observations N.

For relatively small errors, the frequency estimation error $\tilde{w}_{d,N} = \hat{w}_d - w_{d,N}$ has variance approximately $$K \frac{\sigma^2}{2} \left( \sum_{j=1}^{N} t_j^2 \right)^{-1}$$

For the case of uniform sampling $t_j = jT_s$, where $T_s$ is the sampling period. Substituting for $t_j$ and letting $T = NT_s$ denote the observation period, $$E[\hat{w}_N^2] = \frac{\sigma^2}{2} K \frac{6}{N(N+1)(2N+1)} \frac{1}{T_s^2} \frac{1}{A^2} \quad (15)$$

In terms of the unsampled system, if the additive noise process has one-sided noise spectral density $N_0$, then $\sigma^2 = 2N_0/T_s$. Thus, $$E[\hat{w}_N^2] \approx \frac{N_0}{P} \frac{6}{T^3} \frac{K}{4}; \; T = NT_s \quad (16)$$

where $P = A^2/2$ is the received signal power and $K$ has value approximately equal to 4 for low values of n.

We note here that in the derivation of Equation 16, the approximation error in Equation 5 has been ignored. It is difficult to estimate the error due to such finite approximation. However, from a few computer simulations, it appears that for $n > w_d T = (w_d T_s)N$, such error is small.

The estimator Equation 12 for $w_d$ from the parameter matrix $\theta$, though simple from the computational viewpoint, may not provide the minimum possible estimation error variance* for w as it ignores the other components of $\theta$. In theory, if the number of terms in the parameter matrix is sufficiently large, one may first estimate, by direct summation, the terms $A \cos \phi \sin w_d$, $A \cos \phi \cos w_d$, $A \sin \phi \sin w_d$, and $A \sin \phi \cos w_d$ without losing any optimality in the estimation, as these terms are related linearly to $\theta$. From these estimates one obtains the estimates for $\phi$ and $w_d$. Provided that $|w_d| < \pi/2$, such an estimate for $w_d$ is unique. The bound on $w_d$ is ensured via a simple normalization described subsequently in Section 6 of the paper. It may be noted that the errors associated with various elements of $\hat{\theta}$ are necessarily correlated.

Alternatively, one may resort to one of the several possible ad hoc procedures to exploit the additional information contained in the estimates $w_d^n$, $n > 1$. In one such procedure, in estimating the magnitude of $w_d$, one may simply compute the average of the nth roots of $|w_d^n|$ for $n = 1, 2 \ldots$ Perhaps a very systematic procedure to obtain $\hat{w}_d$ from $\hat{\theta}$ is the application of the least square method to this problem. According to this method, with $\hat{Y}_i$ denoting the estimate of $A|w_d|^i$ for $i = 1, 2, \ldots, n-1$, the estimate of $|w_d|$ is $$|\hat{w}_d| = \sum_{i=1}^{n-1} \hat{Y}_{i-1}^2 \; {}^{-1} \sum_{i=1}^{n-1} \hat{Y}_i \hat{Y}_{i-1}$$

To obtain $\hat{w}_d$ (including sign) we repeat the above procedure with $\hat{Y}_i$ replaced by the estimate of one of $A$ (sin $\phi$) $w_d^i$ $A$ (cos $\phi$) $w_d^i$ or an average of these two terms. As the estimate of $|w_d|$ is independent of the phase $\phi$, it may be more robust and thus it may be worthwhile to compute both $|\hat{w}_d|$ and $w_d$ at the cost of some redundancy.

It may however be noted that the improvements provided by such modifications may not be significant, if the expectations of $w_d^n$, are relatively small in relation to their variances, as would be the case for small values of $w_d$.

To keep the dimension n of the parameter matrix small, the following estimation method is proposed. Dividing both sides of Equation 16 by $\Omega^2$, where $\Omega$ denotes the maximum possible value of $w_d$, and substituting $T = n/\Omega$, one obtains $$\frac{E[\hat{w}_d^2]}{\Omega^2} = 6 \frac{N_0}{P} \frac{\Omega}{n^3} \quad (17)$$

Selecting a value of 1/36 for the left hand side of the above equation allows one to express the maximum frequency uncertainty that can be resolved by the algorithm has a function of n. Thus, $$\Omega = \frac{n^3}{216} \frac{P}{N_0} \quad (18)$$

The rationale for selecting the value of 1/36 for $E[\hat{w}_d^2]/\Omega^2$, is as follows. Since the additive noise has a Gaussian distribution, one may assume that the frequency estimation error has a Gaussian distribution with its standard deviation denoted by $\sigma(\hat{w}_d)$. The above selection thus ensures that $3\sigma(\hat{w}_d) < \Omega/2$.

Now, for any given value of n (related to the algorithmic complexity permitted) and the $P/N_0$ ratio, the value of maximum possible initial frequency uncertainty $\Omega$ is calculated from the expression 18 above. The total estimation period is then divided into intervals of $T_0 = n\Omega^{-1}$ seconds and the numerically controlled oscillator (NCO) frequency and phase are adjusted at the end points of these intervals in the following manner.

Denoting by $w_{d0}$ the difference frequency (frequency of the signal at the phase detector output) at $t = 0+$, its estimate $\hat{w}_{d0}$ is obtained on the basis of observations $y_k$, $z_k$; $1 < k < K_0$ where $K_0 = T_0/T_s$ is the number of samples (assumed to be an integer) in any $T_0$ seconds interval and $t_k = (k-1)T_s$. At the end of the first $T_0$-seconds interval, the NCO frequency is adjusted by $\hat{w}_{d0}$ such that the resulting difference frequency $w_{d1}$ in the time interval $(T, 2T)$ is simply equal to $\hat{w}_{d0} = w_{d0} - \hat{w}_{d0}$. We also note that from the above selection of $T_0$, max $(w_{d1}) < 0.5$ max $(w_{d0})$. The cumulative phase $\phi(t)$ of the signal at the phase detector output is then $$\begin{aligned}\phi(t) &= w_{d0}T_0 + w_{d1}(t - T_0) + \phi_0; \; T < t < 2T \quad (19)\\ &= w_{d1}t + (w_{d0} - w_{d1})T_0 + \phi_0 \\ &= w_{d1}t + \hat{w}_{d0}T_0 + \phi_0\end{aligned}$$

Thus, if in addition to the frequency correction a phase correction $\Delta \phi = \hat{w}_{d0}T_0$ is introduced to the NCO (over an interval of $T_0 - T_s$ to $T_0$ seconds), then the resulting phase is simply equal to $w_{d1}t + \phi_0$ for $T_0 < t < 2T_0$. Thus, the estimation of $w_{d1}$ can be obtained by processing observations $y_k$, $z_k$, $K_0 < k < 2K_0$ using the least-squares algorithm with its initial estimate set equal to zero. It should be noted that the knowledge about the error variance of the previous estimates must also be included as a priori information in the least-squares algorithm.

With $\theta_1$ denoting the parameter matrix obtained by replacing $w_d$ by $w_{d1}$ in the matrix $\theta$ defined earlier in Equations 4 and 5, its estimate $\hat{\theta}_{1,2K_0}$ obtained on the basis of observations $y_k$, $z_k$; $1 < k < 2K_0$ is given by $$\hat{\theta}_{1,2K_0} = \left( \sum_{j=1}^{2K_0} x_j x'_j \lambda^{2K_0-j} \right)^{-1} \left( \sum_{j=K_0+1}^{2K_0} x_j Z'_j \lambda^{2K_0-j} + \left( \sum_{j=1}^{K_0} x_j x'_j \lambda^{2K_0-j} \right) \hat{\theta}_{1,2K_0} \right) \quad (20)$$

In Equation 20 $\hat{\theta}_{1,2K_0}$ is obtained by replacing $\hat{w}_d$ by 0 (the a priori estimate of $w_{d1}$) in $\hat{\theta}_{0,K_0}$ which denotes the estimate of $\theta_1$ obtained on the basis of observations $y_k$, $z_k$; $1 < k < K_0$. We note that the maximum product of frequency uncertainty and observation period given by max $w_{d1} \cdot 2T_0$ is smaller than $\Omega T_0 < n$ and thus the required dimension n of the parameter matrix need not be increased for the increased time interval $2T_0$.

The above procedure can be generalized to subsequent $T_0$-seconds intervals in a straightforward manner, while the bound on frequency uncertainty and the length of observation period product remains satisfied for all t. This is so because, in view of Equation 16 above, the product $E[\hat{w}^2]T^2$ in fact decreases with the increase in total observation period T.

From the development above it is apparent that the estimation error variance is still given by Equation 16 providing that the peak frequency uncertainty is within three times the RMS frequency estimation error. If this condition is violated, increased truncation errors may result. Also, by selecting the data weighting coefficient $\lambda$ to be strictly less than 1, the algorithm can track a slowly varying input signal frequency $w_0$. In this case, for example, $w_{d1} = \hat{w}_{d0} + \Delta w$, where $\Delta w$ represents the change in the input signal frequency $w_0$ over the first $T_0$-seconds intervals. Such a variation is taken into account in the error covariance matrix in Equations 11 and 20 by adding an appropriate 'dynamic noise covariance matrix' Q to it at each $T_0$-seconds interval.

In an equivalent implementation, $\hat{\theta}$ and hence $\hat{w}_d$ may be made recursive in each measurement $y_k$, $z_k$, using a standard recursive least-squares algorithm and thereby also eliminating the need for a matrix inversion. Detailed calculations of the number of computations per sample (a function of n, T, $K_0$ etc.) would dictate the more specific implementation so as to minimize the computational requirements.

In an alternative approach to keep the value of n fixed and small with an increase in the total observation period, instead of resetting the frequency reference (making a correction in the NCO frequency) the time reference is reset to zero. Subsequent observations in Equation 1 are now with respect to a different phase-reference, say $\tilde{\phi}$ denoted $\tilde{\phi}$. At this stage the observations in the second $T_0$ interval are processed to have the phase reference $\hat{\phi}$ and are then combined with the first set of observations. Equivalently, it is required to postmultiply the second sum on the right hand side of Equation 6, obtained for the second subinterval of $T_0$, by the following matrix:

$$\begin{bmatrix} \cos(\Delta\phi) & -\sin(\Delta\phi) \\ \sin(\Delta\phi) & \cos(\Delta\phi) \end{bmatrix},$$

where: $\Delta\phi = \hat{\phi} - \tilde{\phi}$ and add the result to the corresponding sum for the first $T_0$ interval. The first sum on the right hand side of Equation 6 is simply multiplied by a factor of 2. This procedure is extended in an appropriate manner to subsequent intervals, so as to obtain a final estimate for $w_d$ and $\phi$ based on the complete set of observations.

Wherefore, having thus described the invention, what is claimed is:

1. A method for accurately and quickly estimating signal parameters comprising a signal frequency of a signal of interest, said method comprising:
   a) inputting the signal of interest;
   b) generating a reference signal with adjustable reference signal parameters comprising a reference frequency;
   c) mixing the signal of interest with said reference signal and a signal 90° out of phase with said reference signal to produce a mixed signal and sampling said mixed signal to provide an error signal comprising a pair of quadrature sampled signals having error signal parameters comprising a difference frequency equal to a difference between said signal and reference frequencies;
   d) computing estimates from said error signal of said error signal parameters employing a least squares estimation; and,
   e) adjusting said adjustable reference signal parameters of said reference signal as a function of estimates of corresponding ones of said error signal parameters in a manner which reduces said error signal parameters, whereby said adjustable signal parameters approximate said signal parameters of said signal of interest.

2. The method of claim 1 wherein: sampling said mixed signal at a sampling rate $1/T_s$ during successive uniform computation periods $T_0$;
   said computing step comprises computing successive estimates of said error signal parameters during said successive computation periods; and
   said adjusting step comprises adjusting said adjustable parameters at the end of each successive computation period, whereby each error signal parameter generally decreases in successive computation periods.

3. The method of claim 2 wherein:
   said computing step employs a matrix which transforms between said pair of quadrature signals and a state vector which is a function of the time of sampling by said sampling means, said matrix comprising coefficients which are functions of said error signal parameters obtained by a power series expansion, said power series expansion being of order n, wherein n is the dimension of said state vector.

4. The method of claim 3 wherein:
   said computing step comprises producing said matrix by least squares estimation and computing said estimates from said matrix.

5. The method of claim 3 wherein:
   said signal parameters comprise the frequency and phase of said signal of interest, and wherein n is selected to be a function of a maximum uncertainty $\Omega$ in the frequency of said signal of interest and the computation period $T_0$ is selected to be $n/\Omega$.

6. The method of claim 5 wherein said function of $\Omega$ is $(\Omega N_0 C/P)^{\frac{1}{2}}$; wherein:
   P is the power of said signal of interest, 7. The method of claim 6 wherein C is approximately in the order of 216.

8. The method of claim 2 wherein:

said signal parameters comprise the frequency and phase of said signal of interest, and wherein said adjusting step comprises adjusting the reference frequency of said reference signal by an amount corresponding to the estimate produced by said computing step of the frequency of said error signal and adjusting the phase of said reference signal by an amount corresponding to the product of said estimate of said frequency of said error signal multiplied by said computation period.

9. The method of claim 1 wherein:

said signal of interest comprises plural sinusoids and wherein the signal parameters of each sinusoid are estimated.

10. A system for accurately and quickly estimating signal parameters comprising a signal frequency of a signal of interest, said system comprising:

a) input means for inputting the signal of interest;

b) a numerically controlled oscillator for generating a reference signal with adjustable signal parameters comprising a reference frequency at an output thereof;

c) mixing means connected to said input means and said output of said numerically controlled oscillator for mixing the signal of interest with said reference signal and a signal 90° out of phase with said reference signal and sampling means for sampling the output of said mixing means to provide an error signal comprising a pair of quadrature sampled signals having error signal parameters comprising a difference frequency equal to a difference between said signal and reference frequencies;

d) computation means for computing from said error signal estimates of said error signal parameters employing a least squares estimation; and, e) correction means for adjusting said adjustable reference signal parameters as a function of estimates of corresponding ones of said error signal parameters in a manner which reduces said error signal parameters, whereby said adjustable signal parameters approximate said signal parameters of said signal of interest.

11. The system of claim 10 wherein:

said sampling means periodically samples the output of said mixing means at a sampling rate of $1/T_s$ during successive uniform computation periods $T_o$;

said computation means computes successive estimates of said error signal parameters during said successive computation periods; and said correction means adjusts said adjustable parameters at the end of each successive computation period, whereby each error signal parameter generally decreases in successive computation periods.

12. The system of claim 11 wherein:

said computation means employs a matrix which transforms between said pair of quadrature signals and a state vector which is a function of the time of sampling by said sampling means, said matrix comprising coefficients which are functions of said error signal parameters obtained by a power series expansion, said power series expansion being of order n, wherein n is the dimension of said state vector.

13. The system of claim 12 wherein:

said computation means comprises means for producing said matrix by least squares estimation and means for computing said estimates from said matrix.

14. The system of claim 12 wherein:

n is selected to be a function of a maximum uncertainty $\Omega$ in the frequency of said signal of interest and the computation period $T_0$ of said sampling means is selected to be $n/\Omega$.

15. The system of claim 14 wherein said function of $\Omega$ is $(\Omega N_0 C/P)^{\frac{1}{2}}$, wherein:

P is the power of said signal of interest, $N_0$ is the noise spectral density, and C is a selected constant numerical value.

16. The system of claim 15 wherein C is approximately in the order of 216.

17. The system of claim 11 wherein:

said signal parameters comprise the frequency and phase of said signal of interest, and wherein said correction means adjusts the frequency of said reference signal by an amount corresponding to the estimate produced by said computation means of the frequency of said error signal and adjusts the phase of said reference signal by an amount corresponding to the product of said estimate of said frequency of said error signal multiplied by the sampling period of said sampling means.

18. The system of claim 10 wherein:

said signal of interest comprises plural sinusoids and wherein the signal parameters of each sinusoid are estimated.

19. The system of claim 10 wherein:

said computation means provides said error signal parameters as a real time confidence measure as to accuracy of said estimates whereby the closer said error signal parameters are to zero, the higher the probability that said estimates are accurate.

20. The system of claim 10 wherein:

said computation means includes a matrix as part of an estimation algorithm implemented thereby which provides an estimate of the variance of an estimation error.

21. The system of claim 1 wherein:

said computing step provides said error signal parameters as a real time confidence measure as to accuracy of said estimates whereby the closer said error signal parameters are to zero, the higher the probability that said estimates are accurate.

22. The system of claim 1 wherein:

said computing step employs a matrix as part of an estimation algorithm implemented thereby which provides an estimate of the variance of an estimation error.

* * * * *